(12) United States Patent
Goetz et al.

(10) Patent No.: US 7,719,746 B2
(45) Date of Patent: May 18, 2010

(54) HIGH PERFORMANCE CHIRPED ELECTRODE DESIGN FOR LARGE AREA OPTOELECTRONIC DEVICES

(75) Inventors: Peter G. Goetz, Springfield, VA (US); William S Rabinovich, Silver Spring, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 138 days.

(21) Appl. No.: 12/210,665

(22) Filed: Sep. 15, 2008

(65) Prior Publication Data

US 2009/0073536 A1    Mar. 19, 2009

Related U.S. Application Data

(60) Provisional application No. 60/972,179, filed on Sep. 13, 2007.

(51) Int. Cl.
*G02F 1/03* (2006.01)
*G02B 26/00* (2006.01)

(52) U.S. Cl. ..................... 359/245; 359/237

(58) Field of Classification Search .......... 359/245, 359/248, 254, 237; 257/14–16, E31.033, 257/E31.034
See application file for complete search history.

(56) References Cited

U.S. PATENT DOCUMENTS

| | | | |
|---|---|---|---|
| 5,020,153 A | 5/1991 | Choa et al. | |
| 5,093,833 A | 3/1992 | Pang et al. | |
| 5,117,301 A | 5/1992 | Tsumura | |
| 5,355,241 A | 10/1994 | Kelley | |
| 5,479,539 A | 12/1995 | Goldsmith et al. | |
| 5,608,561 A | 3/1997 | Marcuse et al. | |
| 5,844,709 A | 12/1998 | Rabinovich et al. | |
| 5,966,227 A | 10/1999 | Dubois et al. | |
| 6,154,299 A | 11/2000 | Gilbreath et al. | |
| 2007/0189779 A1 | 8/2007 | Murphy et al. | |

OTHER PUBLICATIONS

Goetz, P.G., Rabinovich, W.S., Binari, S.C., and Mittereder, "High-Performance Chirped Electrode Design for Cat's Eye Retro-Reflector Modulators", IEEE Photonic Technology Letters, vol. 18, No. 21, Nov. 1, 2006, pp. 2278-2280.

(Continued)

*Primary Examiner*—Jack Dinh
(74) *Attorney, Agent, or Firm*—Amy L. Ressing; Sally A. Ferrett

(57) ABSTRACT

An electro-optic device with a doped semiconductor base and a plurality of pixels on the semiconductor base, each pixel including: a multiple quantum well formed on the semiconductor base, an oppositely doped semiconductor layer on the multiple quantum well, and a top electrode on the semiconductor layer, the top electrode shaped to produce an approximately uniform lateral resistance in the pixel. An embodiment is a large area modulator for modulating retro-reflector systems, which typically use large area surface-normal modulators with large lateral current flow. Uniform resistance to each part of the modulator decreases location dependence of frequency response. A chirped grid electrode balances semiconductor sheet resistance and metal line resistance components of the series resistance.

5 Claims, 9 Drawing Sheets

OTHER PUBLICATIONS

Goetz, P.G., Binari, S.C., Mahon, R., Swingen, L., and Rabinovich, W.S., "High-Speed Cat's Eye Multiple Quantum Well Modulating Retroreflectors", viewgraphs shown at SPIE Annual Meeting, San Diego, CA, Jul. 31, 2005.

Goetz, P.G., R. Mahon, T.H. Stievater, W.S. Rabinovich, and S.C. Binari, "High-speed large-area surface-normal multiple quantum well modulators", Proc. SPIE, vol. 5160, pp. 346-354, Jan. 2004.

Serreze, H. B., "Optimizing Solar Cell Performance by Simultaneous Consideration of Grid Pattern Design and Interconnect Configuration," 1978. Conference Record of the IEEE Photovoltaic Specialists Conference pp. 609-614, 13th IEEE PVSC, 1978.

Fritz et al., "Vertical-Cavity optical modulator for 1.32 um grown on graded (InGaAl)As buffer", Appl. Phys. Lett. vol. 63, No. 4, Jul. 26, 1993, pp. 494-491.

Handerek, V. A. and Laycock, L.C., "Feasibility of retroreflective free-space optical communication using retroreflectors with very wide field of view," Proc. SPIE Int. Soc. Opt. Eng. 5614, pp. 1-9, Dec. 2004 (Conference date Oct. 28, 2004).

Hallstig, E., Ohgren, J., Allard, L., Sjoqvist, L., Engstrom,D., Agren, D., Junique, S., Noharet, B., "Retrocommunication using electroabsorption modulators and nonmechanical beam steering", Optical Engineering, vol. 44, No. 4, Apr. 2005, pp. 045001-1-045001-8.

Gilbreath et al., NRL Memorandum Report NRL/MR/8120-97-9875, Performance Characteristics of a Retroreflector Array Optimized for LEO Spacecraft, Dec. 31, 1997.

Biermann, M. L., Rabinovich, W. S., Mahon, R., and Gilbreath, G. C., "Design and Analysis of a Diffraction-Limited Cat's-Eye Retroreflector," Optical Engineering, vol. 41, Iss. 7, pp. 1655-1660 (Jul. 2002).

Burgers, A. R., "How to design optimal metallization patterns for solar cells", Progress in Photovoltaics: Research and Applications; vol. 7, No. 6, pp. 457-461, 1999.

Creamer, N.G., Gilbreath, G.C., Meehan, T.J., Vilcheck, M.J., Vasquez, J.A., Rabinovich, W.S., and Goetz, P.G., "Interspacecraft Optical Communication and Navigation Using Modulating Retroreflectors," Jour.of Guidance Control and Dynamics, vol. 27, No. 1, pp. 100-106 (Jan./Feb. 2004).

Davidson, F. M., Bucaille, S., Gilbreath, G. C., and Oh, E., "Measurements of Intensity Scintillations and Probability Density Functions of Retroreflected Broadband 980-Nm Laser Light in Atmospheric Turbulence," Optical Engineering, vol. 43, Iss. 11, pp. 2689-2695 (Nov. 2004).

Gilbreath, G. C., Rabinovich, W. S., Meehan, T. J., Vilcheck, M. J., Stell, M., Mahon, R., Goetz, P. G., Oh, E., Vasquez, J. A., Cochrell, K., Lucke, R. L., and Mozersky, S., "Progress in Development of Multiple-Quantum-Well Retromodulators for Free-Space Data Links," Optical Engineering, vol. 42, Iss. 6, pp. 1611-1617 (Jun. 2003).

Gilbreath, G. C., Rabinovich, W. S., Meehan, T. J., Vilcheck, M. J., Mahon, R., Burns, R., Ferraro, M., Sokolsky, I., Vasquez, J. A., Bovais, C. S., Cochrell, K., Goins, K. C., Barbehenn, R., Katzer, D. S., Ikossi-Anastasiou, K., and Montes, M. J., "Large-Aperture Multiple Quantum Well Modulating Retroreflector for Free-Space Optical Data Transfer on Unmanned Aerial Vehicles," Optical Engineering, vol. 40, Iss. 7, pp. 1348-1356 (Jul. 2001).

Gilbreath, G.C., Creamer, N. G., Rabinovich, W. S., Meehan, T.J., Vilchek, M.J., Vasquez, J.A. Mahon, R., Oh, E., Goetz, P.G., and Mozersky, S., "Modulating retro-reflectors for space, tracking, acquisition, and ranging using multiple quantum-well technology", Proc. SPIE 4821, pp. 494-507 (Dec. 2002).

Katzer, D. S., Rabinovich, W. S., Ikossi-Anastasiou, K., and Gilbreath, G. C., "Optimization of Buffer Layers for InGas/AlGaAs Pin Optical Modulators Grown on GaAs Substrates by Molecular Beam Epitaxy," Journal of Vacuum Science & Technology B, vol. 18, Iss. 3, pp. 1609-1613 (May/Jun. 2000).

Murphy, J.L., Gilbreath, G.C., Rabinovich, W.S., Sepantaie, M.M., and Goetz, P.G., "FM-MRR analog audio system", Proc. SPIE 5892, pp. 58921X1-58921X8 (Oct. 2005).

Murphy, J.L., Gilbreath, G.C., Rabinovich, W.S., Sepantaie, M.M., and Goetz, P.G., "FM-MRR analog audio system", poster, SPIE Conference, Free Space Laser Communications V, Aug. 1, 2005.

Namazi, N., Burris, H. R., Conner, C., and Gilbreath, G. C., "Synchronization and Detection of Binary Data in Free-Space Optical Communication Systems Using Haar Wavelet Transformation," Optical Engineering, vol. 45, Iss. 1, pp. 015001-1-015001-13 (Jan. 2006).

Rabinovich, W. S., Mahon, R., Burris, H. R., Gilbreath, G. C., Goetz, P. G., Moore, C. I., Steil, M. F., Vilcheck, M. J., Witkowsky, J. L., Swingen, L., Suite, M. R., Oh, E., and Koplow, J., "Free-Space Optical Communications Link at 1550 Nm Using Multiple-Quantum-well Modulating Retroreflectors in a Marine Environment," Optical Engineering, vol. 44, Iss. 5, pp. 056001-1-056001-12 (May 2005).

Walters, R. J., Murphy, J. L., Rabinovich, W. S., Gilbreath, G. C., Wilt, D. M., Smith, M. A., Krasowski, M. J., Jenkins, P. P., Scheiman, D., Warner, J. H., Messenger, S. R., Lorentzen, J. R., and Summers, G. P., "Photovoltaically Powered Modulating Retroreflectors," Optical Engineering, vol. 45, Iss. 3, pp. 034003-1-034003-6 (Mar. 2006).

Rabinovich, W.S., Goetz, P.G., Mahon, R., Swingen, L., Murphy, J., Gilbreath, G.C., Binari, S.C., and Waluschka, E., "Performance of cat's eye modulating retro-reflectors for free-space optical communications", Proc. SPIE 5550, pp. 104-114 (Oct. 2004).

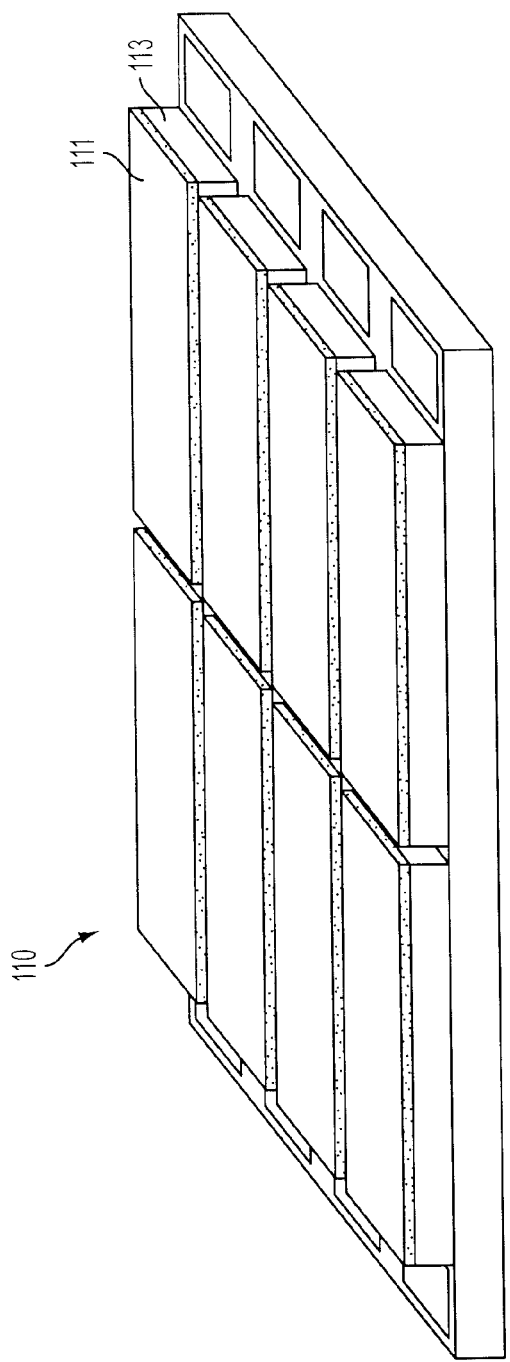
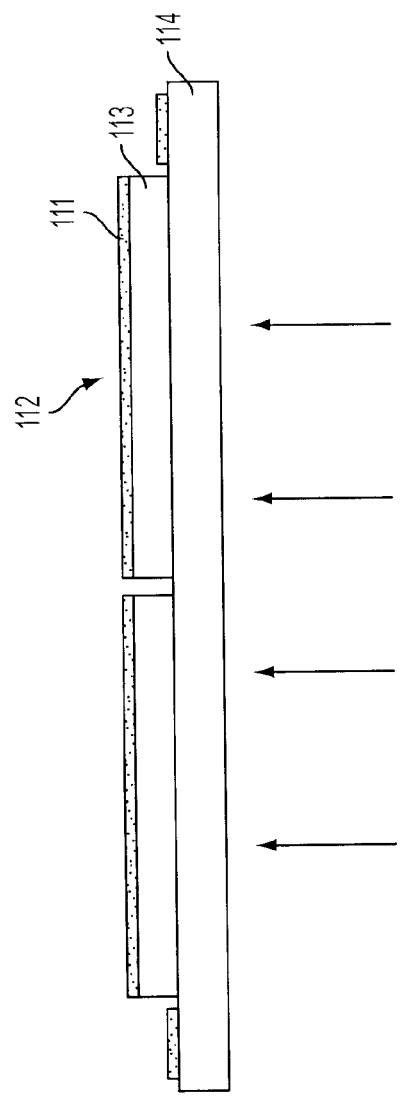
FIG. 8A
FIG. 8B

HIGH PERFORMANCE CHIRPED ELECTRODE DESIGN FOR LARGE AREA OPTOELECTRONIC DEVICES

CROSS-REFERENCE TO RELATED APPLICATIONS

This Application is a Non-Provisional of Provisional (35 USC 119(e)) application 60/972,179 filed on Sep. 13, 2007, the entire disclosure of which is incorporated by reference herein.

BACKGROUND OF THE INVENTION

1. Technical Field

This application is related to electrical contacts or electrodes for large area electro-optic devices, and more specifically, for electrical contacts for modulating retroreflectors, photodiodes, and other large area optoelectronic devices.

2. Related Technologies

Large area surface-normal optoelectronic devices include modulating retroreflectors (MRR) and large area photodiodes (PDs). Both MRRs and PDs can be designed either with or without focusing optics.

A modulating retroreflector developed by the Naval Research Laboratory is described in U.S. Pat. No. 6,154,299 to G. Charmaine Gilbreath, Steven R. Bowman, William S. Rabinovich, Charles H. Merk, and H. E. Senasack, "Modulating retroreflector using multiple quantum well technology", the entire disclosure of which is incorporated by reference herein. The modulating retroreflector allows free-space optical communication between a node with minimal power, weight, and pointing ability (e.g., a UAV) and a node with higher power, weight, and pointing ability (e.g. a ground station).

Modulating retroreflectors were demonstrated before the invention of the laser, but were restricted to short distances and low data rates. The first known description of a modulating retroreflector for free-space optical communication is in Harry Stockman, "Communications by Means of Reflected Power," Proceedings of the IRE, pp. 1196-1204, October 1948. Recent advances in optoelectronic devices and free-space optics have greatly increased the capabilities of MRR systems. Examples are discussed in "Peter G. Goetz, William S. Rabinovich, Rita Mahon, Mike S. Ferraro, James L. Murphy, H. Ray Burris, Mena F. Stell, Chris I. Moore, Michelle R. Suite, Wade Freeman, G. C. Gilbreath, and Steven C. Binari, "Modulating Retro-Reflector Devices and Current Link Performance at the Naval Research Laboratory," MILCOM 2007, Orlando, Fla., October 2007."

There are two basic classes of retro-reflectors, "cat's eye" and corner cube retro-reflectors. "Cat's eye" retro-reflectors combine lenses and/or mirrors and incorporate an optical focus. Several variations of cat's eye retro-reflectors are described in in Mark L. Biermann, et al, "Design and analysis of a diffraction-limited cat's-eye retroreflector," Opt. Eng. 41, 1655 (2002).

Corner cube retro-reflectors (CCRs) are nonfocusing. Tradeoffs between modulating retro-reflectors of the corner cube type and the cat's eye type are discussed in "Peter G. Goetz, William S. Rabinovich, Rita Mahon, Lee Swingen, G. Charmaine Gilbreath, and James Murphy, "Practical Considerations of Retroreflector Choice in Modulating Retroreflector Systems," IEEE LEOS 2005 Summer Topicals, talk TuA3.5, San Diego, Calif., 25-27 Jul. 2005.

Gridded electrodes for use in solar photovoltaic cells are discussed in H. B. Serreze, "Optimizing Solar Cell Performance by Simultaneous Consideration of Grid Pattern Design and Interconnect Configuration," 1978. Conference Record of the IEEE Photovoltaic Specialists Conference pp. 609-614, 13th IEEE PVSC, pp. 609-614, 1978, and in A. R. Burgers, "How to design optimal metallization patterns for solar cells", Progress in Photovoltaics: Research and Applications; Vol. 7, No. 6, pp 457-461, 1999.

BRIEF DESCRIPTION OF THE DRAWINGS

FIGS. 8A and 8B illustrate a transmissive modulator with a reflective metallic top contact for each pixel that acts as both the electrical contact and the mirror and extends over the entire pixel.

DETAILED DESCRIPTION OF PREFERRED EMBODIMENTS

Embodiments of the invention are directed to modulators for modulating retroreflectors, to photodiodes, and to other electro-optic devices.

The contact electrodes described herein are useful in electro-optic devices including large area modulators with focusing optics and without focusing optics, and large area photodiodes with focusing optics and without focusing optics. Use of the electrodes described herein can improve performance of these devices, for uniformity of bandwidth, or for the balance of lateral resistance with optical efficiency caused by shadowing of the device by the metal electrodes.

Note that only the epitaxially grown layers of the semiconductor layers are shown in these diagrams. Additional structure can be present, such as a semiconductor wafer.

Figure 1:
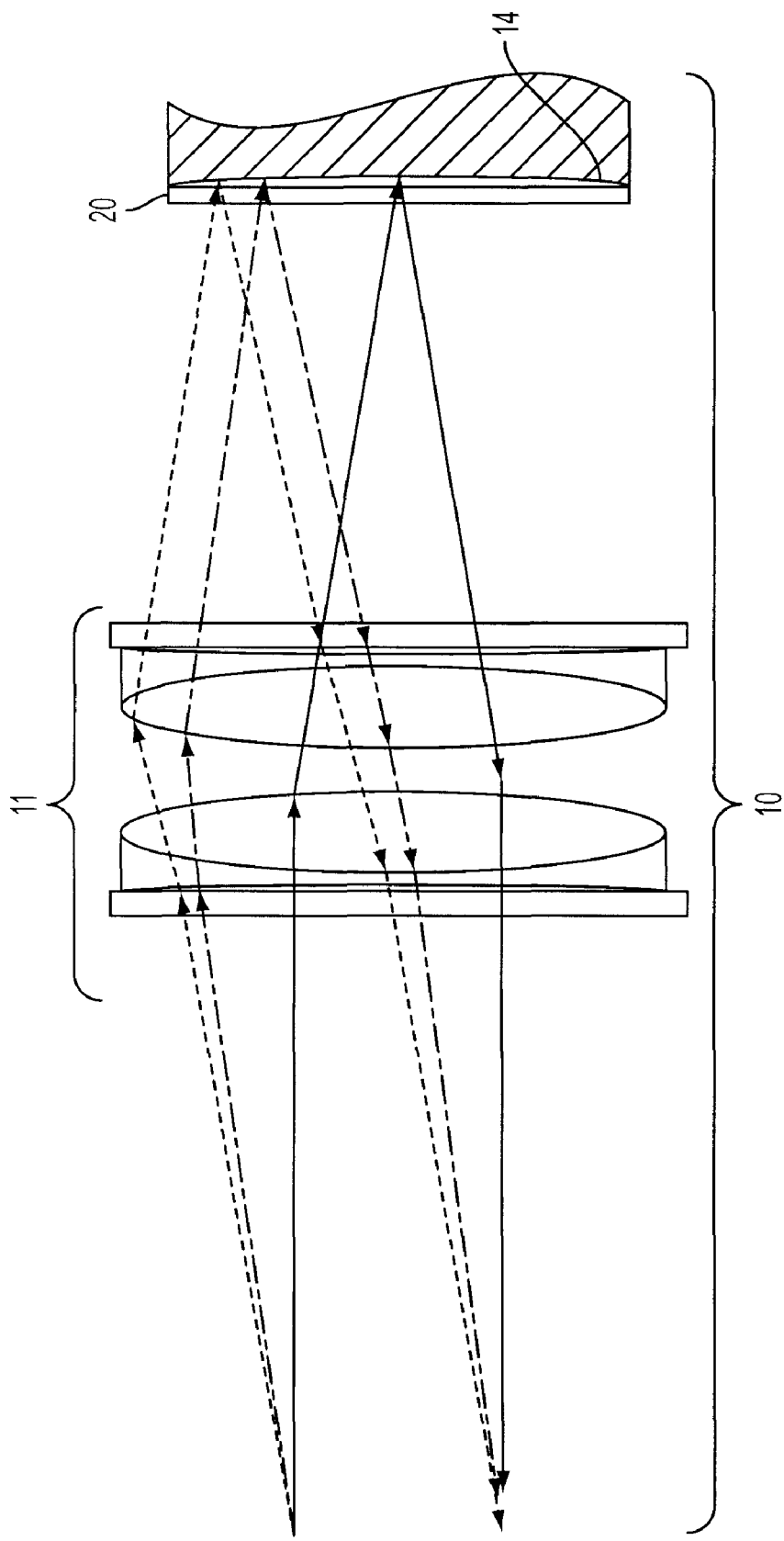
FIG. 1 illustrates a cat's eye modulating retroreflector system.
Figure 2:
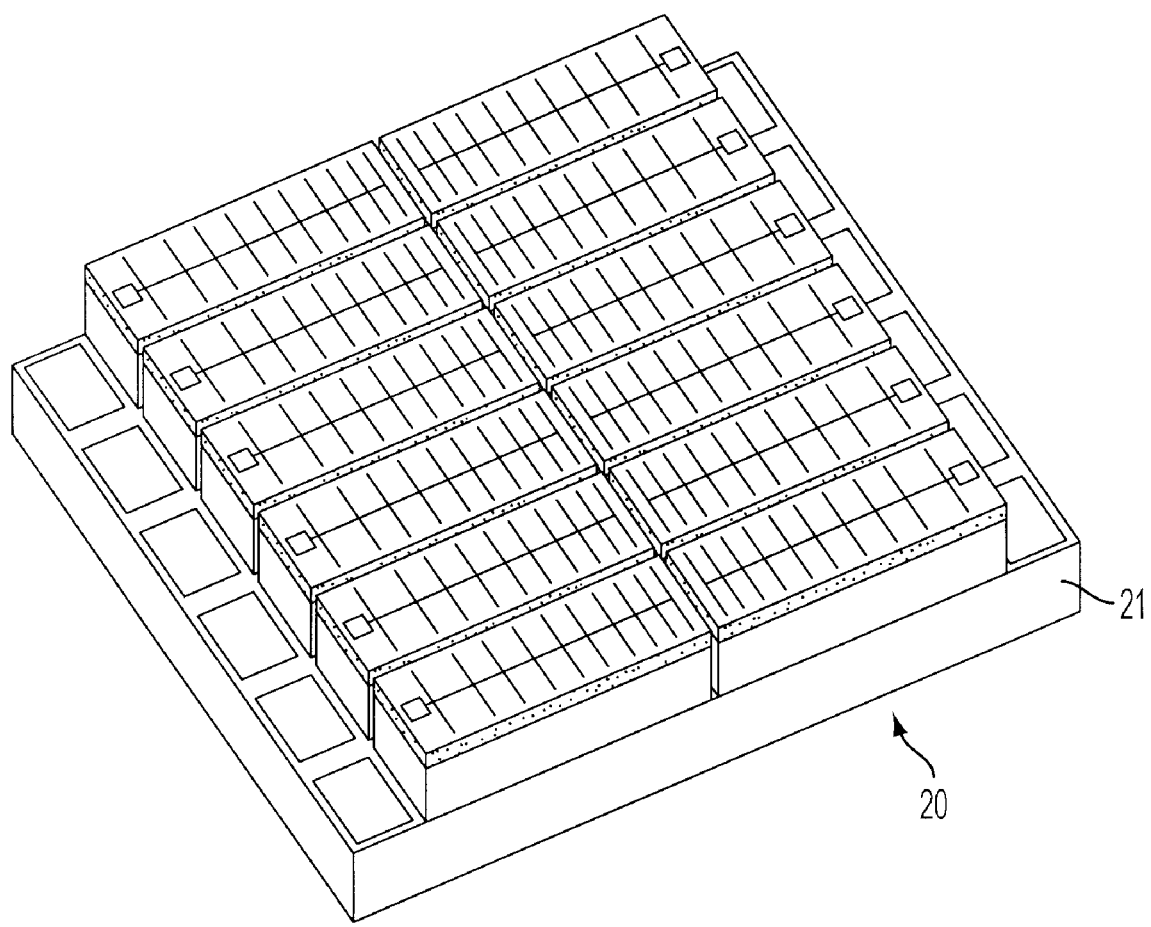
FIG. 2 is an illustration of a chirped electrode in accordance with an aspect of the invention.

FIG. 1 illustrates a cat's eye modulating retroreflector 10, which includes lenses 11, a reflector 14, and an electro-optic modulator 20 arranged in front of the reflector 14.

Cat's eye modulating retroreflectors allow increased data rates and ranges compared to corner cube-based modulating retroreflectors, however they are more complex. The use of focusing optics in cat's eye retro-reflectors enables them to have large optical apertures with small, and thus fast, modulators. However, the location of the focal point on the mirror depends on the angle of incidence. Modulators are typically placed at or very near the focal surface. As can be seen in FIG. 1, the angle of incidence determines the location of the focused spot on the modulator 20. Large area devices provide a large field of view (FOV), but only a small spot on the retroreflector's modulator 20 is illuminated at any one time. For example, the illuminated spot can have a diameter of about ten to a few hundred microns.

Use of a cat's eye retroreflector design imposes some design considerations on a modulating retroreflector. For example, most modulating retroreflectors to date use a large area, surface-normal modulator. A flat focal plane most easily accommodates these flat modulators and is required if the modulators are reflective. However, curved focal surfaces can produce the best results in terms of f/# and field of view. This drives positioning of electrical contacts to the periphery of the array, typically by wirebonding. Peripheral contacts are also used for reflective modulators on absorptive substrates, with illumination from the epitaxially grown side of the device. Peripheral contacts can also be used with other types of modulators to simplify packaging.

Figure 3A:
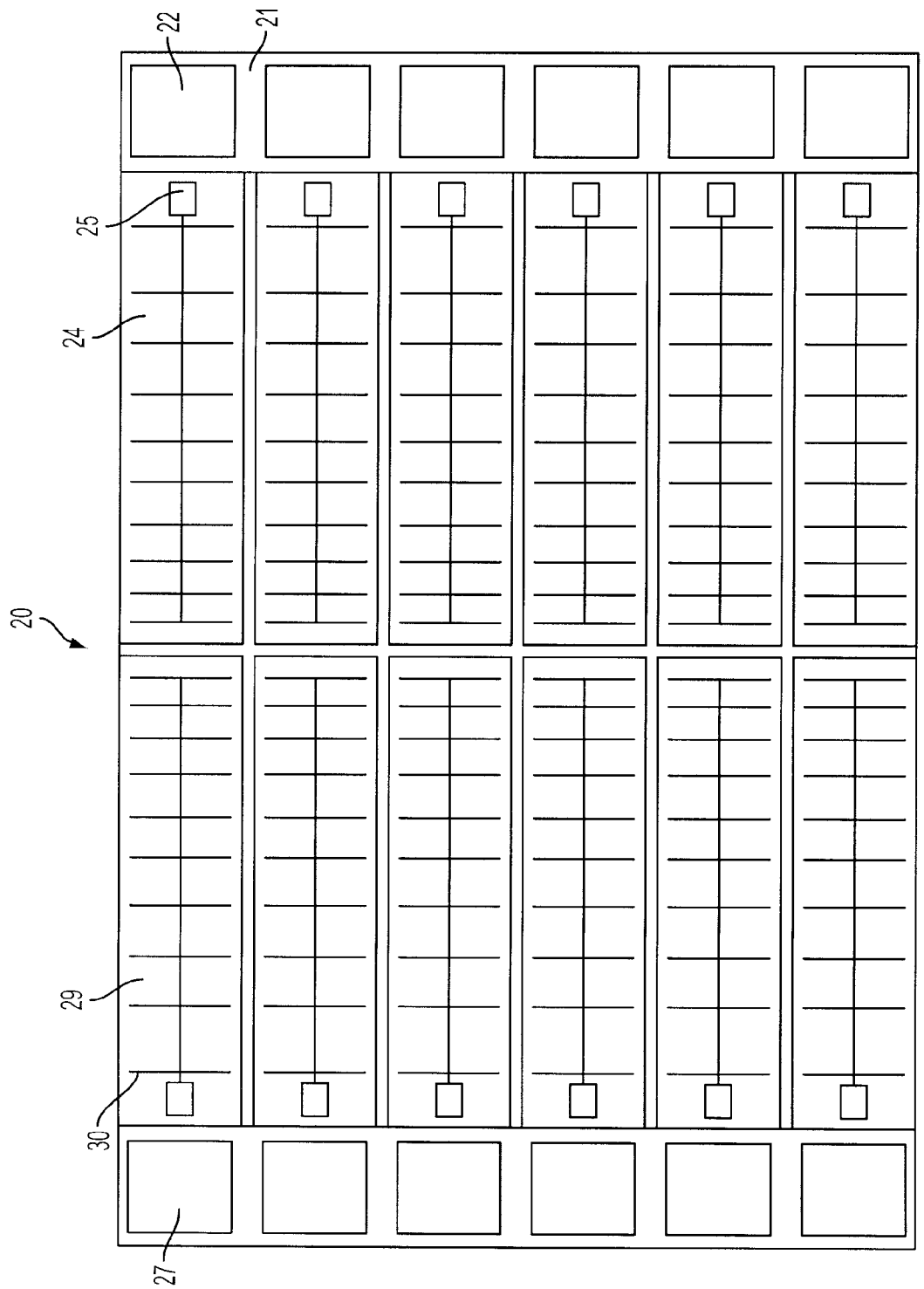
FIG. 3A is a top view of the chirped electrode of FIG. 2.
Figure 3B:
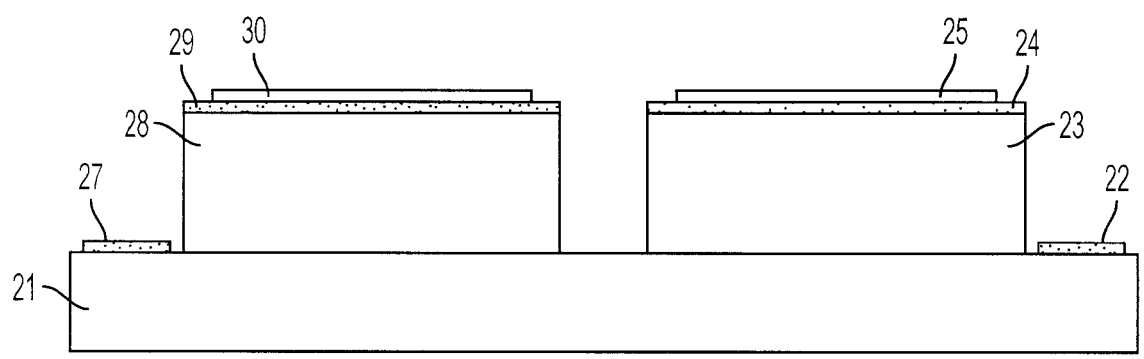
FIG. 3B is a side view of the chirped electrode of FIG. 2.

FIGS. 2, 3A, 3B, and 4 illustrate an exemplary electro-optic modulator 20 that can be used in a cat's eye modulating retroreflector such as the FIG. 1 retroreflector system or in a corner cube retroreflector system. FIG. 3A is a top view of the modulator 20, and FIG. 3B is a cross sectional view of the modulator 20. The modulator 20 is formed of an array of pixels, in order to take advantage of the small active area while still covering the entire field of view. Each pixel is larger than the expected spot size.

The same basic design could be used to make a wide field of view photoreceiver by replacing the modulator array with a photodiode array, which can be used as a matched optic to detect arrival angle to intelligently drive a modulator array, as described in "William S. Rabinovich, Peter G. Goetz, Rita Mahon, Lee Swingen, James Murphy, Michael Ferraro, H. Ray Burris, Jr., Christopher I. Moore, Michelle Suite, G. Charmaine Gilbreath, Steven Binari, and David Klotzkin, "45-Mbit/s Cat's Eye Modulating Retroreflectors," *Optical Engineering*, vol. 46, no. 10, 104001, October 2007."

Figure 4:
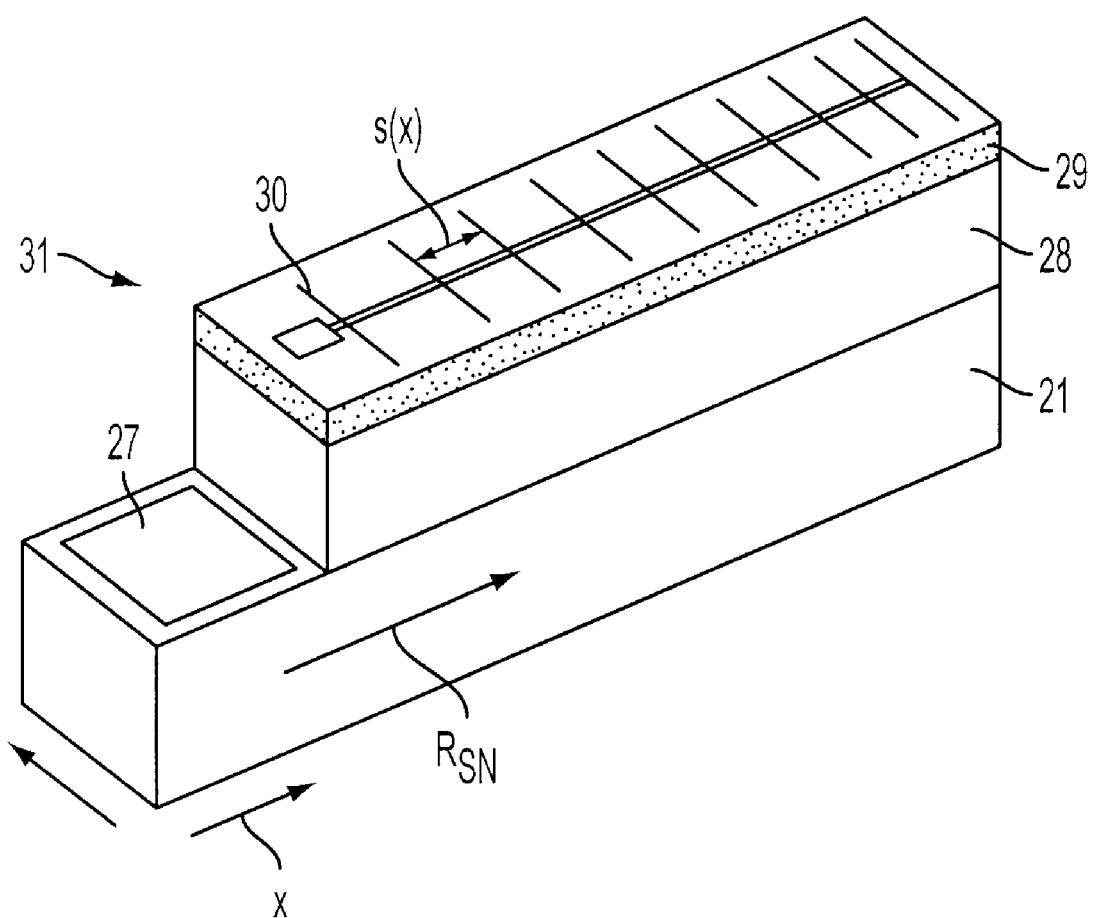
FIG. 4 illustrates one pixel of the chirped electrode of FIG. 2.

In an exemplary embodiment, each pixel in the modulator 20 has a p-i-n diode configuration, having an n-type semiconductor layer in contact with an n-metal contact, an intrinsic region multiple quantum well, and a p-type semiconductor layer in contact with a p-metal electrical contact. For example, FIG. 4 shows one pixel of the modulator 20, with an n-type semiconductor base 21, an n-metal contact 27, an intrinsic region containing multiple quantum wells 28, and a p-type semiconductor layer 29 in contact with a p-type metal electrical contact 30. It should be noted that the intrinsic region of a photodiode would not necessarily contain a multiple quantum well.

The pixels each have an n-type semiconductor base, n-metal electrode, multiple quantum well, top layer of p-type semiconductor material, and p-metal electrode. In the exemplary embodiment, each pixel may have its own n-type electrodes or share a common n-type electrode. The electrical contacts 27 and 30 are arranged so electrical contact with each pixel is made on the periphery of the modulator. Each pixel can be driven independently.

The modulator 20 is arranged so interrogating light is surface-normal to the modulator.

The top electrical contact 30 can be any metal or combination of metals, deposited on the p-semiconductor layer 29 by electron beam evaporation or another suitable technique. The intrinsic region 28 may contain a multiple quantum well consisting of alternating layers of epitaxially grown semiconductor. In an exemplary embodiment, each pixel has a top electrical contact grid which is designed to make the lateral resistance across the pixel as small and as uniform as possible. For an arbitrary spot on a pixel, the lateral resistance $R_{lateral}(x, y)$ is $R_{lateral}(x, y)=R_m(x, y)+R_{sn}(x, y)+R_{sp}(x, y)$, where $R_m$ is the resistance of the metallic grid conductor, $R_{sn}$ is the lateral sheet resistance of the n-type semiconductor layer, and $R_{sp}$ is the lateral sheet resistance of the p-type semiconductor layer. Both $R_m$ and $R_{sn}$ increase with the distance from the electrical contact.

Alternative non-chirped modulator designs that have been measured have shown a decrease in frequency response as the y distance from the wirebond/bondpad increases due to this increase in $R_m$ and $R_{sn}$. (In order to keep $R_{lateral}$ as uniform as possible across the device, $R_m+R_{sn}$ must be balanced by $R_{sp}$.)

For the chirped-grid electrode modulator, the $R_{sp}$ at a location is determined primarily by the distance from the location to the metal grid of the top electrode. The p-metal grid structure has a main bus extending longitudinally along the center of the p-semiconductor layer, and a number of fingers extending perpendicularly to the main bus on the top of the p-semiconductor layer. The spacing between fingers is larger in the region closest to the n-metal contact 27, and is smaller in the region furthest from the n-metal contact 27. This decrease in spacing causes a decrease in $R_{sp}$, balancing the increase in $R_m+R_{sn}$.

The pixelization of the modulator array provides a first level of equalization of the lateral resistance, in addition to taking advantage of the small spot size of the retroreflector lens system.

The grid structure of the top electrical contact divides the individual pixels into "unit cells" for a second level of equalization of the lateral resistance $R_{sp}$. In this embodiment, the unit cell is the final level of equalization, and the slowest part of the unit cell is midpoint between the fingers, farthest from the main bus.

Figure 5A:
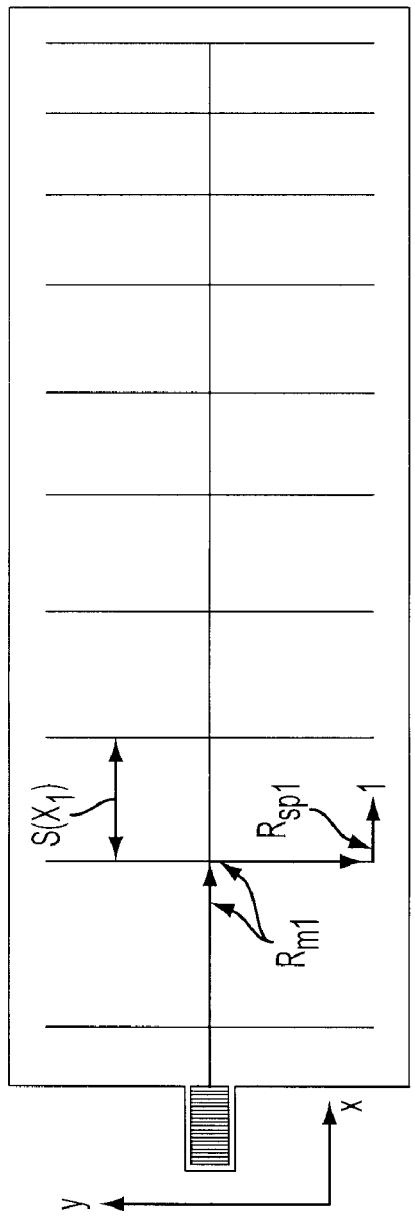
FIGS. 5A and 5B illustrate spacing between fingers of the grid electrode shown in FIG. 4.
Figure 5B:
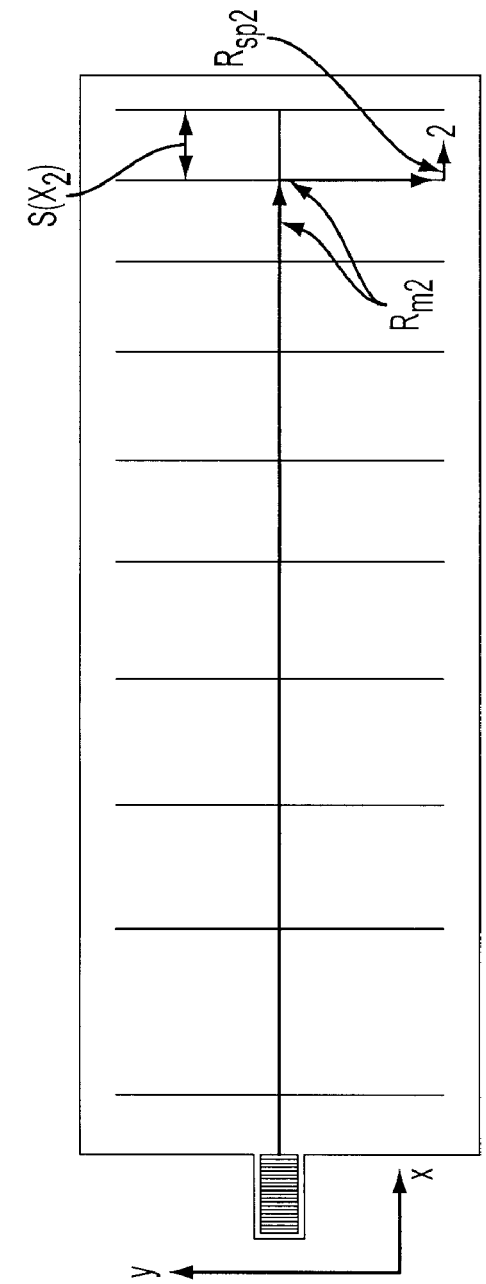

As illustrated in FIGS. 5A and 5B, equalization of the frequency response between unit cells is accomplished with a variable finger pitch S(x). This creates a "chirped" design, in a manner similar to chirped designs of diffraction gratings. Unit cells closest to the electrical contact 27 have the largest finger pitch S(x), and the pitch decreases as distance from the electrical contact 27 increases. By comparing points 1 and 2 in FIGS. 5A and 5B respectively, it is seen $R_{m2}$ is larger than $R_{m1}$ due to the distance from the electrode bond pad, and $R_{sp2}$ is smaller than $R_{sp1}$ due to the smaller spacing S(x) between fingers farther away from the bond pad. The sum of $R_{m1}+R_{sp1}$ is nearly equal to the sum of $R_{m2}+R_{sp2}$.

The finger location for the single bus design of FIG. 5 can be characterized by the equation $x_n=x_0+n*S_{max}-\delta*[n(n-1)/2]$, for $n=0, 1, 2, \ldots$, where $x_0$ is the position of the first finger, $S_{max}$ is the maximum finger pitch, $\delta$ is the pitch decrement, and n is the finger index. However, different spacing can be used, depending on design trade-offs.

An optimum finger pitch can be determined by the bus width, finger width, and metal contact shadowing factor.

The highest density of fingers is far from the electrical contacts, making the optical transmission of the modulator lowest at normal incidence, for example, when the light hits the center of the array. However, the retroreflector optics have an opposite dependence on angle. The retroreflector optics have an optical return that is highest at normal incidence. The net effect is a beneficial flattening of the modulating retroreflector optical return as a function of angle.

The main busbar can be tapered, with the widest part near the bondpad, and the narrowest part farthest from the bondpad or can have approximately the same width throughout its length.

For a given metal shadowing factor, the finger width $W_F$ is preferably as thin as technologically feasible. In addition, metal widths for the busbar and fingers should be significantly smaller than the spot size in the active area of a cat's eye MRR modulator or photodiode, in order to eliminate or minimize dead spaces. Therefore, large width busbars that are used in some solar cell designs are not suitable for MRR modulators. Preferably, the MRR modulator electrodes include long, thin fingers and busbars, and/or multiple busbars per pixels.

Wide peripheral contacts, such as those used in solar cell electrode designs, can be used in MRR modulator electrodes; however, they typically are not optimized in terms of reduced resistance versus added capacitance of the shadowed inactive area required for the wide peripheral contacts.

It is preferred that the top contact metal is not reflective at the operational wavelengths, to avoid the contact acting as a mirror in the cat's eye optic and retroreflecting unmodulated light back to the illuminating laser. One method for avoiding such shiny metal contacts is to electroplate the top contacts. Another method is to anneal the top contact, to decrease the reflectance of the evaporated metal. Other methods include using other absorptive or less reflective films to cover the electrode grid and to prevent reflections.

One determination to make in grid design is whether to grow the modulator structure as p- or n-type contact on top. An important function of the chirped grid design is to make the frequency response across the surface of the pixel as low and as uniform as possible. Increasing the thickness of the doped semiconductor contact layers, e.g. layers 21 and 24/29 in FIG. 3B, can reduce resistance to a point, but the effect is not as large as produced by the chirped grid contact design of FIG. 5. Thick top contact layers would increase the mesa height and add to processing complexity. In contrast, using a thick semiconductor base as the bottom contact makes processing simpler by relaxing the accuracy needed to etch to the bottom contact layer. Since the mobility of electrons is an order of magnitude greater than that of holes, the wafers are preferably grown with the p-type contact as the top contact. This allows the metal grid pattern to improve the performance of the lowest mobility (p-type) contact; a thicker bottom contact maintains low resistance in the n-type contact.

While FIGS. 5A and 5B illustrate a single degree of finger metallization, the chirped electrode design can be extended to higher levels of metallization, with the first level of fingers acting as busbars for the next level of fingers.

Figure 6:
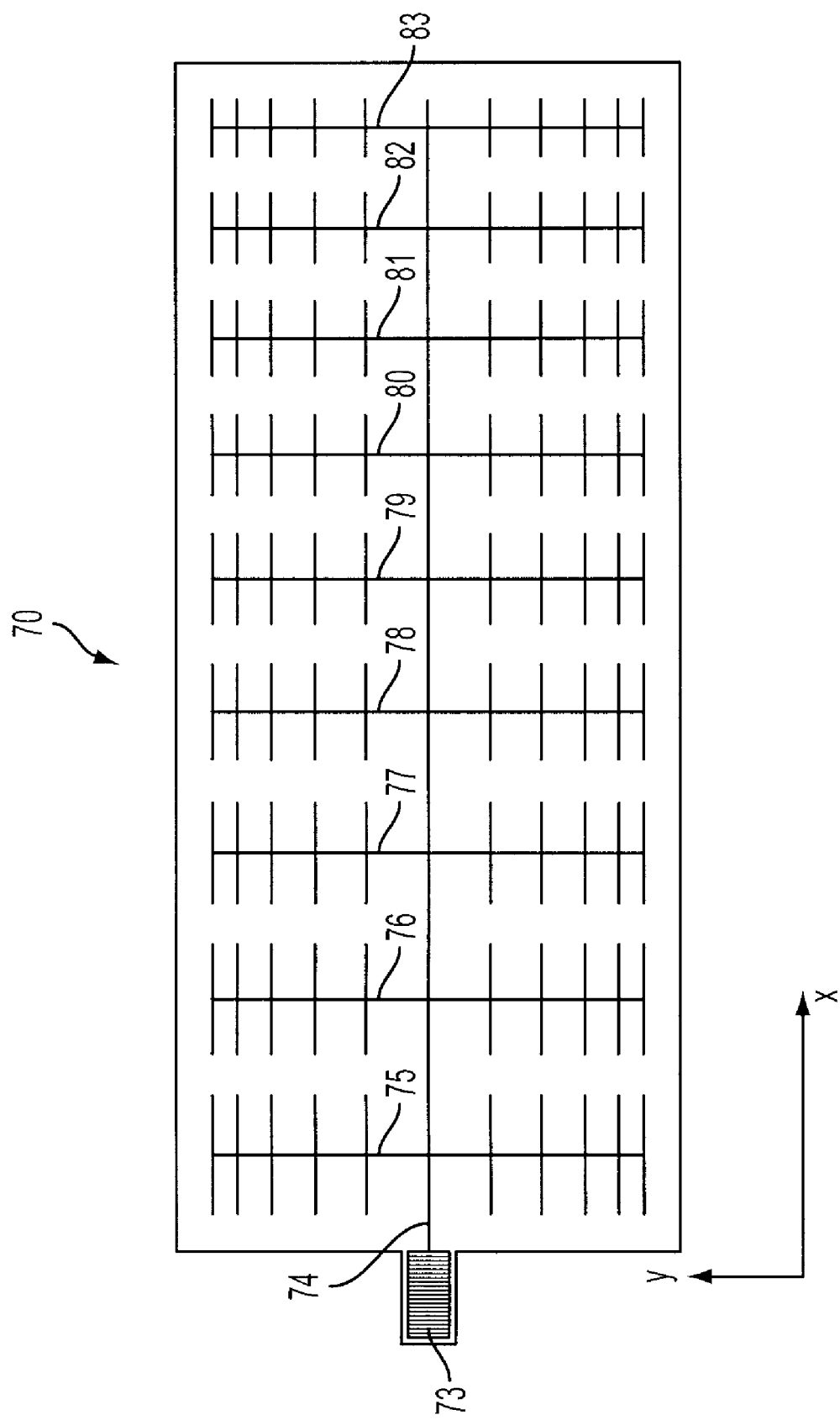
FIG. 6 illustrates a two-level chirped electrode grid in accordance with an aspect of the invention.
Figure 7:
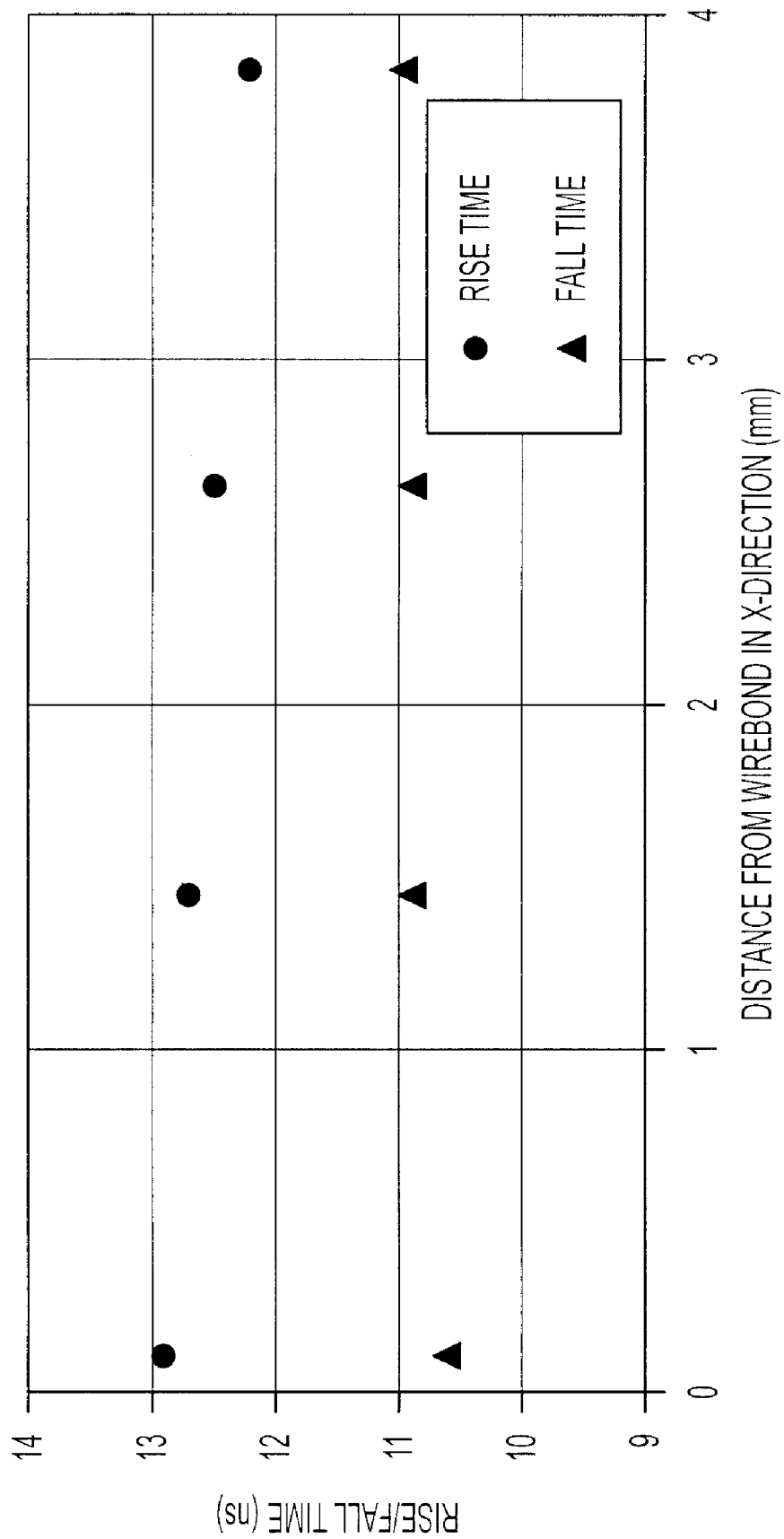
FIG. 7 illustrates the 20%-80% rise time and 20%-80% fall times as a function of distance from the electrical wirebond contact for an exemplary modulating retroreflector.

FIG. 6 illustrates a pixel with a two-layer chirped grid electrode layout. The p-type grid electrode 71 is in contact with the top p-doped semiconductor layer 72, and includes a bondpad 73, a main busbar 72 extending in the x direction along the top of the semiconductor layer 72, and a number of fingers 74-82 that extend in the y direction. The fingers have a spacing pitch that decreases linearly with increasing distance from the bondpad. To achieve another dimension of equalization, a series of perpendicularly arranged smaller fingers extend in the y direction from each of the electrode fingers. The smaller fingers are also chirped in design, with a spacing pitch that decreases with increasing distance from the busbar 74. The busbar 74 can have a constant width, or a tapered width that decreases with increasing distance from the bondpad 73.

The device of FIGS. 2-5 can also act as a large-area photodiode with reduced lateral resistance, and the electrode design of FIG. 6 can be used in a large area photodiode.

Such photodiodes, are usually p-i-n, and may or may not include a multiple quantum well in the intrinsic region. The photodiode can include any semiconductor material, including Silicon.

While the exemplary embodiment shown in FIGS. 2-5 has a p-type top contact and an n-type bottom, it is also envisioned that the top contact can be an n-type and the bottom can be a p-type.

EXAMPLE

An 8 mm by 8 mm modulator with a chirped grid electrode was designed for a cat's eye modulating retroreflector. The device was segmented into a 6×2 array of pixels. A chirped top contact was deposited using electron beam evaporation.

In this example, the finger width $W_F$ for electron beam evaporation is about 4 microns. However, the finger width can be wider or narrower, (e.g., a few microns). Electroplating could be used to allow narrower with thicker metal for the same or lower overall resistance.

The maximum width of the busbar was set at 22 microns, tapering down to about 12 microns at the far end of each pixel. This busbar is wider than desired optically, however, based on previous designs, an average metal coverage of 2.3% was determined sufficient for the desired bandwidth yet still optically acceptable. This metal coverage, the busbar geometry, and the minimum $W_F$ set the number of fingers at eighteen, the maximum pitch $S_{max}$ at 300 microns, and the pitch decrement $\delta$ at 10 microns. The finger pitch decreases linearly from near the bondpad to a minimum at the far end of the busbar.

This example modulator was tested on a transmissive stage. A fiberoptic probe was used to illuminate the modulator from above, and the light was collected underneath into a 125-MHz photodetector. In this manner, the light could be localized onto any area of the modulator.

Measurements were taken at the midpoint between the tips of the grid fingers for various values. The modulator was driven with a square wave using a low impedance driver, and the 20%-80% rise and 80%-20% fall times were measured using a digital oscilloscope with a filtered bandwidth of 150 MHz. The electrical drive signal going to the modulator had a measured rise time of 2.0 ns and fall time of 1.8 ns. Measurement results in FIG. 8 show that good uniformity of rise and fall times is achieved. Variations of approximately 5% in rise and fall time across a four millimeter long modulator device were measured. By comparison, alternative designs with a pixelated modulator with uniformly spaced electrode grids can have variations in rise and fall times of up to 300%.

Of particular interest is the decrease in rise time with increasing distance from the wirebond. This improvement in risetime due to overcompensation of the increasing $R_m + R_{sn}$ clearly demonstrates the utility of the chirped grid design in compensating for accumulation of lateral resistances.

Modulators used in modulating retroreflector systems are typically large area surface normal devices with large current flow. Frequency response is limited by the resistance-capacitance (RC) time constant. In the cat's eye modulating retroreflector systems with focusing optics, only a small part of the total modulator area is illuminated at a time. The uniform resistance to each part of the modulator provided by the pixelated, chirped electrode designs herein decreases location dependence of the modulator's frequency response. Location dependence of the modulator's frequency response causes angle dependence of frequency response in cat's eye MRRs.

Advantages of the pixelated, chirped electrode grid MRRs discussed herein include the ability to locate the electrical contacts at the periphery of the modulator to simplify wiring and increase pixel density and low and uniform lateral resistance, which produces a fast and uniform frequency response across the entire modulator area.

Moreover, eliminating the use of more metal than necessary in parts of the modulator that do not require it can reduce production costs. In addition, certain failures in epitaxially-grown semiconductor devices have been associated with metal coverage of pit defects, resulting in shorts across the device. These shorts are primarily of concern with large area devices such as MQW modulators. Eliminating unnecessary metallization can decrease the probability of such shorts, which is directly related to the metal area coverage, and thus can increase yield.

Embodiments of the invention are also directed to modulating retro-reflector systems which do not use focusing optics, and to large-area photodiodes. One example of a MRR without focusing optics is a corner-cube retro-reflector.

Modulators in modulating retroreflectors and large-area photodiodes that do not use focusing optics can also suffer from the above-mentioned lack of uniformity in lateral resistance. Although these devices are not angle-dependent, modulators with uniformly spaced metal grids are not optimized to balance the shadowing effect of the metal grid with the lateral resistance reduction provided by the metal grid, so different areas of these devices can operate at different speeds. Some designs provide excessive metallization in areas of the device to increase speeds, leading to additional shadowing and lower optical efficiency. Large area photodetectors can also suffer from lack of uniformity in frequency response.

FIGS. 8B and 8A illustrate a modulator 110 with a transmissive substrate, suitable for use in a flat focal plane cat's eye retroreflector. The modulator shown is configured in a 2×4 pixel array, although different number of pixels is also suitable. The pixels can also be non-rectangular, for instance a circular modulator array can be made up of pie-shaped pixels. The reflective metallic top contact 111 acts as both the electrical contact and the mirror. The contact extends over the entire pixel 112. In each pixel, the reflective metallic top contact is layered over the i-type multiple quantum well 113, which is in contact with the common base semiconductor layer 114. The modulator is mounted so the light 115 enters the modulator from the substrate side. The substrate can be thinned and polished to minimize absorption. The metal thickness would then avoid significant variations of frequency response within a pixel.

Interior pixels can be electrically contacted with either wirebonding or flip chip bonding without obscuring the optical path. Peripheral contact is no longer necessary, so optical considerations need not be considered in the location of the contact, and contact location can be optimized solely on electrical considerations.

An advantage of this modulator is that there is no need for a separate reflector, such as the reflector 13 of FIG. 1.

Drawbacks of this arrangement include making heatsinking of the device more difficult, as neither surface of the modulator is available for direct contact with a heat sink. It also has the potential of lowering on-wafer yield, as the metal area is greatly increased, and any pit defects in the epitaxy which extend beyond the top contact could result in shorted devices. Optically, this method also puts the active modulator layers as close as possible to the focal surface, which minimizes the spot size, and can concentrate the optical power more than with the chirped electrode designs discussed above. A decrease in modulator contrast ratio has been observed with increased optical power density, which could limit this method's utility with high optical powers such as are used in long distance applications.

Note that the FIGS. 8A-8B device can also act as a photodiode, with or without multiple quantum wells.

In the modulators and photodiodes described above, the size of the pixels is a design tradeoff between complexity and speed. The diameter of the optical spot on the modulator array is can be between about 10 to 100 μm, which gives a lower bound to the useful pixel size.

These examples include systems with multiple pixels. However, optoelectronic systems in accordance with other embodiments of the invention are not pixelated or have only one pixel.

Although this invention has been described in relation to the exemplary embodiments thereof, it is well understood by those skilled in the art that other variations and modifications can be affected on the preferred embodiment without departing from scope and spirit of the invention as set forth in the claims.

What is claimed as new and desired to be protected by Letters Patent of the United States is:

1. An optoelectronic device comprising:
   a doped semiconductor base; and
   at least one pixel formed on the base, each pixel including:
      an oppositely doped semiconductor layer,
      an intrinsic region including a multiple quantum well formed between the base and the oppositely doped semiconductor layer,
      and a top electrode formed on the oppositely doped semiconductor layer, wherein the top electrode is a plurality of parallel conductive fingers in electrical communication with each other, wherein the spacing between the fingers decreases with distance from one edge of the pixel.

2. A device according to claim 1, wherein the device is a modulator for a modulating retroreflector.

3. A device according to claim 1, wherein the device is a photodiode.

4. A device according to claim 1, wherein the shape of the top electrode produces an approximately uniform lateral resistance throughout the pixel.

5. A device according to claim 1, wherein the at least one pixel formed on the base includes a plurality of pixels.

* * * * *